(12) United States Patent
Siddiquie et al.

(10) Patent No.: US 9,219,462 B2
(45) Date of Patent: Dec. 22, 2015

(54) MODULAR INTERFACE SYSTEMS AND METHODS

(75) Inventors: Adnan A. Siddiquie, Houston, TX (US); Fangyong Dai, Tomball, TX (US); Luis C. Armendariz, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 350 days.

(21) Appl. No.: 13/825,638

(22) PCT Filed: Sep. 22, 2010

(86) PCT No.: PCT/US2010/049861
§ 371 (c)(1),
(2), (4) Date: Mar. 22, 2013

(87) PCT Pub. No.: WO2012/039710
PCT Pub. Date: Mar. 29, 2012

(65) Prior Publication Data
US 2013/0187731 A1    Jul. 25, 2013

(51) Int. Cl.
*H03H 7/01*    (2006.01)
*H01R 13/66*   (2006.01)
*H03H 7/06*    (2006.01)
(Continued)

(52) U.S. Cl.
CPC ............... *H03H 7/06* (2013.01); *H01R 13/665* (2013.01); *H01R 13/719* (2013.01); *H01R 24/64* (2013.01); *H03H 7/01* (2013.01)

(58) Field of Classification Search
CPC ......... H03H 7/01; H03H 7/06; H01R 13/648; H01R 13/665; H01R 24/64
USPC ........... 333/260; 439/620.01, 620.09, 620.11, 439/620.21, 620.23
See application file for complete search history.

(56) References Cited

U.S. PATENT DOCUMENTS

| 5,197,128 A | 3/1993 | Campbell et al. |
| 6,431,892 B1 | 8/2002 | Shupe et al. |

(Continued)

FOREIGN PATENT DOCUMENTS

| CN | 1777180 | 5/2006 |
| GB | 2402269 A | 1/2004 |

(Continued)

OTHER PUBLICATIONS

International Search Report and Written Opinion received in PCT Application No. PCT/US2010/049861, mailed on Mar. 31, 2011, pp. 9.

(Continued)

*Primary Examiner* — Dean Takaoka
*Assistant Examiner* — Alan Wong
(74) *Attorney, Agent, or Firm* — HP Legal Department

(57) ABSTRACT

Interface systems and methods are provided. An interface system can include a first isolator (200) and a second isolator (300) coupled to a modular interface (110). The interface can include a plurality of conductors (120). The first isolator can be coupled to a first signal format compliant first input/output (I/O) device (130). The second isolator can be coupled to a second signal format compliant second I/O device (140). The first isolator can pass a first signal format compliant signal to, and suppress the reflection of at least a portion of a second signal format compliant signal from, the first I/O device. The second isolator can at least partially block a first signal format compliant signal from, and to pass a second signal format compliant signal to, the second I/O device.

12 Claims, 4 Drawing Sheets

(51) Int. Cl.
*H01R 13/719* (2011.01)
*H01R 24/64* (2011.01)

(56) References Cited

U.S. PATENT DOCUMENTS

| | | | |
|---|---|---|---|
| 6,459,323 B2 * | 10/2002 | Birkeli | H04L 25/0272 326/62 |
| 6,561,852 B2 | 5/2003 | Lo | |
| 6,563,864 B1 * | 5/2003 | Ibrahim et al. | H04B 3/04 370/487 |
| 6,884,104 B2 | 4/2005 | Homer | |
| 7,141,986 B2 | 11/2006 | Muth et al. | |
| 7,686,653 B2 * | 3/2010 | Binder | 439/638 |
| 7,933,521 B2 * | 4/2011 | Wen et al. | 398/135 |
| 2003/0211782 A1 | 11/2003 | Esparaz et al. | |
| 2005/0213496 A1 | 9/2005 | Binder | |
| 2005/0245134 A1 | 11/2005 | Stiscia | |
| 2007/0167086 A1 | 7/2007 | Tolli | |

FOREIGN PATENT DOCUMENTS

| | | |
|---|---|---|
| JP | 11354214 A | 12/1999 |
| TW | 424352 | 3/2001 |
| TW | M297563 | 9/2006 |
| TW | M312716 | 5/2007 |

OTHER PUBLICATIONS

"RJ45 Jack Used for RJ11", <http://www.computing.net/answers.networking.rj45-jack-used-for-rj11/32675.html>, Retrieved on Mar. 19, 2013.

"XMULTIPLE Technologies Double Sided RJ Connectors", <http://www.xmultiple.com/index54-ultra-multll.htm > Publication Date: Aug. 28, 2007.

* cited by examiner

MODULAR INTERFACE SYSTEMS AND METHODS

BACKGROUND OF THE INVENTION

Description of the Related Art

Interfaces permitting communication between an electronic device and one or more external devices or systems such as data networks, data storage, and video output devices are provided on many electronic devices. In response to an increasing demand for electronic devices having a smaller footprint, designers have reduced the size of the chassis used within the electronic device wherever possible. Such a reduction in chassis size minimizes the internal and external space available for the various interfaces used to provide communication and interfacing between the electronic device and the one or more external devices or systems.

BRIEF DESCRIPTION OF THE DRAWINGS

Advantages of one or more disclosed embodiments may become apparent upon reading the following detailed description and upon reference to the drawings in which:

FIG. 1A is a block diagram depicting an illustrative detail of a modular interface, according to one or more embodiments described;

DETAILED DESCRIPTION

Figure 1:
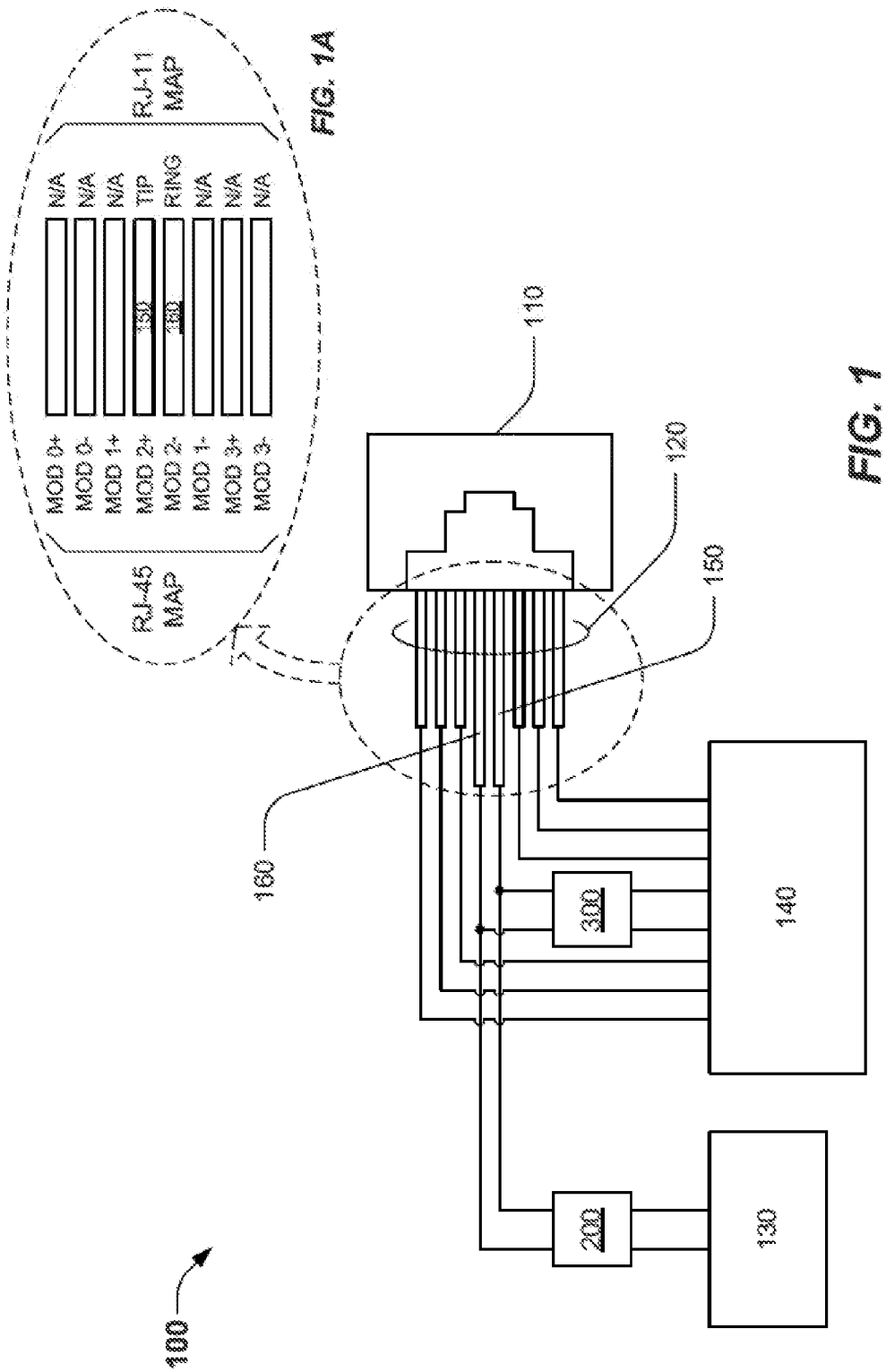
FIG. 1 is a block diagram depicting an illustrative interface system, according to one or more embodiments described.

Electronic devices continue evolve into devices having decreased size and increased performance. While the combination of size and performance can prove a great benefit to consumers, designers of such devices must often struggle to physically accommodate the numerous external device interfaces and supporting hardware within a small chassis electronic device. The use of modular connectors to couple external devices to an electronic device has greatly simplified the process of adding peripheral, external devices for the consumer. These modular connectors however frequently require even greater physical space to accommodate the connector body as well as the interface conductors.

Many electronic devices are provided with a modem to accommodate the connection of the device to a telephonic network. Such a connection can provide a variety of functions including voice, video, and data communication. The connection between the electronic device and the telephonic network can be achieved through the use of a modular connector, for example a Registered Jack 11 (RJ-11) connector. An RJ-11 connector is physically sized to accept six (6) conductors, but generally only four (4) conductors are provided. Of the four conductors in an RJ-11 connector, usually only two (2) are used to establish communication with the telephone network.

Additionally, many electronic devices are provided with a network interface, for example a network interface card (NIC) to accommodate the connection of the device to a computer network, for example Ethernet or Token-Ring computer networks. The connection between the electronic device and the computer network can be achieved through the use of a modular connector, for example a Registered Jack 45 (RJ-45) connector. An RJ-45 connector is physically sized to accept eight (8) conductors, all of which are used to establish a link to the computer network.

The physical characteristics of RJ-11 and RJ-45 connectors permit the insertion of the physically smaller RJ-11 (male) connector into the larger RJ-45 (female) connector. While such physical compatibility may exist between the RJ-11 and RJ-45 connectors, the vastly different signal protocol of the telephonic signals transmitted via the RJ-11 connector and the network signals transmitted via the RJ-45 connector have generally precluded the use of a common interface for both the RJ-11 and the RJ-45 connector. However, the use of a common RJ-11 and RJ-45 modular interface can reduce the number of I/O ports required on the electronic device. By reducing the footprint required to house discrete RJ-11 and RJ-45 interfaces, a physically smaller enclosure can be used.

An interface system is provided. An interface system can include a first isolator and a second isolator coupled to a modular interface. The interface can include a plurality of conductors. The first isolator can be coupled to a first signal format compliant first input/output (I/O) device. The second isolator can be coupled to a second signal format compliant second I/O device. The first isolator can pass a first signal format compliant signal to, and suppress the reflection of at least a portion of a second signal format compliant signal from, the first I/O device. The second isolator can at least partially block a first signal format compliant signal from, and to pass a second signal format compliant signal to, the second I/O device.

As used herein, the term "couple" or "coupled" can refer to any form of direct. Indirect, optical or wireless electrical connection. The electrical connection can include, but is not limited to, any electrically conductive or magnetically inductive connection linking two or more devices, components, or systems. The connection can be electrically conductive, for example using one or more terminals or conductors such as copper or aluminum wire, conductive strips on a printed circuit board, or the like to connect or otherwise link two or more components.

As used herein, the term "signal format" refers to the physical, logical, spatial, temporal, and/or electrical arrangement, configuration, or structure of a signal. A signal format can include analog or digital signals. A signal format can contain one signal or a plurality of multiplexed signals. A signal format can refer to the frequency spectrum in which a signal is transmitted, for example a signal format can include a signal transmitted above or below a frequency threshold, or transmitted within a specified frequency band, for example an amplitude modulation (AM) frequency band (520 kHz-1,610 kHz) or the frequency modulation (FM) frequency band (87.5 to 108.0 MHz).

An interface method is also provided. The method can include transmitting a signal from a modular interface to a first isolator coupled to a first signal format compliant first input/output (I/O) device and to a second isolator coupled to a second signal format compliant second I/O device. The method can further include passing at least a portion of a first signal format compliant signal through the first isolator to the first I/O device and suppressing at least a portion of the reflection of a second signal format compliant signal from the first I/O device. The method can also include passing at least a portion of the second signal format compliant signal through the second isolator to the second I/O device and blocking at least a portion of the first signal format compliant signal from the second I/O device.

Another interface system is also provided. The system can include a modular interface to accommodate a plurality of connectors, for example connectors selected from the group of connectors consisting of a Registered Jack 11 (RJ-11) connector, and a Registered Jack 45 (RJ-45) connector. The system can further include a first signal format compliant first input/output (I/O) device such as a telecommunications interface coupled to the modular interface. The first signal format can include a signal at a frequency of less than 100 Kilohertz (KHz). The system can further include a second signal format compliant second I/O device such as a network interface card (NIC) coupled to the modular interface. The second signal format can include a signal at a frequency of greater than 10 Megahertz (MHz). The system can further include a first isolator disposed between the modular interface and the first I/O device, the first isolator including a minimum resistance of 100 ohms. The first isolator can pass a first signal format compliant signal to the first I/O device and suppresses the reflection from the first I/O device at least a portion of a second signal format compliant signal. The system can also include a second isolator disposed between the modular interface and the second I/O device, the second isolator can include a first order, high-pass. RC filter. The RC filter can include a minimum capacitance of 1,000 pico-Farads (pF) and a maximum resistance of 1,000 ohms. The capacitance can be rated for a maximum voltage of 5,000 Volts (5 kV). The second isolator can at least partially block the first signal format compliant signal from, and pass the second signal format compliant signal to, the second I/O device.

FIG. 1 is a block diagram depicting an illustrative interface system 100, according to one or more embodiments. The system can include a modular interface 110 containing a plurality of conductors 120. All or a portion of the conductors 120 can be coupled to a first input/output (I/O) device 130 and a second I/O device 140. A first isolator 200 can be disposed between the modular interface 110 and the first I/O device 130. A second isolator 300 can be disposed between the modular interface 110 and the second I/O device 140.

The modular interface 110 can include any type of device or system capable of coupling of an external device or system, for example a computer network, a telephonic network, a peripheral device, or the like, to an electronic device. In at least some embodiments, the modular interface 110 can be partially or completely disposed on an exterior surface of the electronic device, for example on the exterior surface of a laptop, portable, tablet, or netbook computer. The modular interface 110 can include one or more industry standard interfaces, for example a Registered Jack 45 (RJ-45 or "Ethernet") interface. The modular interface 110 can accommodate the attachment of two or more standard connectors, for example in some embodiments, the modular interface 110 can be an RJ-45 (Ethernet) jack that can accommodate the attachment of either an RJ-45 (8 conductor network) modular connector or an RJ-11 (4 conductor telephonic) modular connector.

A plurality of conductors 120 can be disposed at least partially within the modular interface 110. The plurality of conductors 120 can include, for example, one or more male contacts, female contacts, blade-type contacts, or the like. Some or all of the plurality of conductors 120 can be coupled to the first isolator 200, the first I/O device 130, or both the first isolator 200 and the first I/O device 130. Similarly, some or all of the plurality of conductors 120 can be coupled to the second isolator 300, the second I/O device 140, or both the second isolator 300 and the second I/O device 140. In at least some embodiments, some or all of the plurality of conductors 120 can be coupled to the first isolator 200, the first I/O device 130, the second isolator 300, and the second I/O device 140 (as depicted in FIG. 1).

Communication between a peripheral device or system and the electronic device can be achieved using the plurality of conductors 120 disposed within the modular interface 110. The plurality of conductors 120 can directly or indirectly link otherwise couple the modular interface 110 to at least a first I/O device 130 and a second I/O device 140. In at least some embodiments, the modular interface 110 can be coupled to a plurality of I/O devices, for example the first I/O device 130 and the second I/O device 140 as depicted in FIG. 1. Where the modular interface 110 is coupled to a plurality of I/O devices, two or more common conductors 150, 160 can be shared between the plurality of I/O devices.

As used herein, the terms "communicate," "communication," and any process referred to as "communicating" can refer to one-way data transmission or receipt or two-way data transmission and receipt. The term can variously refer to, for example, analog or digital data transmission, analog or digital data receipt, or analog or digital data transmission and receiving.

The first I/O device 130 can include any number of systems, devices, or any combination of systems and devices suitable for transmitting and receiving data from the modular interface 110. In some embodiments the first I/O device 130 can include a modem or similar telephonic interface permitting the exchange of data between electronic devices using an external circuit, for example a telephonic communication circuit. Where a modem is used as the first I/O device 130, two of the plurality of conductors 150, 160 can be used to transmit the "tip" and "ring" signals from the modular interface 110 to the modem as depicted in FIG. 1A. The balance of the plurality of conductors 120 within the modular interface 110 can be routed to an alternate destination, for example, as depicted in FIG. 1, to the second I/O device 140.

In at least some embodiments, the first I/O device 130 can include a system interface to a telephone network, for example a telephonic modem. The modem can communicate using a first signal format where the incoming and outbound signals operate at a frequency of less than 100 kilohertz (kHz); less than 80 kilohertz (kHz); or less than 60 kilohertz (kHz). The first signal format can also include one or more maximum operating or test voltages, for example the first signal format can have a maximum test voltage of about 1,000 V (1 kV); about 2,000 V (2 kV); or about 3,000 V (3 kV).

The modem can include one or more protective circuits, including an isolation transformer to protect against damage due to incoming line noise or voltage spikes, an analog-to-digital (A/D) converter to convert incoming analog signals into a digital audio signal, a digital-to-audio converter to convert outgoing digital signals to analog audio signals, and a digital signal processor (DSP) to extract data from the digitized incoming audio signal. The modem can comply with one or more industry standards, for example one or more of the following International Telecommunication Union-Telecommunication Sector (ITU-T) standards: V.32 (9,600 bps), V.32bis (14,400 bps), V.34 (33,600 bps), V.42 (error control), V.42bis (data compression), V.90 (56,000 bps) or V.92 (56,000 bps).

The second I/O device 140 can include any number of systems, devices, or any combination of systems and devices suitable for transmitting and receiving data from the modular interface 110. In some embodiments, the second I/O device 140 can include a network interface card (NIC) or similar network interface permitting the exchange of data between electronic devices using a computer network, for example an Ethernet (10 Mbps, 100 Mbps, or 1.000 Mbps) network or a Token-Ring network. Where a NIC is used as the second I/O device 140, eight of the plurality of conductors 120, including the two common conductors 150, 160 shared with the first I/O device 130, can be used for communication. In some embodiments, where the second I/O device 140 includes an Ethernet compatible NIC, the two common conductors 150, 160 can be used as the MOD 2+ and MOD 2− channel as depicted in FIG. 1A.

Where a NIC is used to provide the second I/O device 140, the NIC can be a discrete device coupled to a bus within the electronic device, or a built-in device, for example a device disposed on the motherboard within the electronic device. The NIC can include one or more isolation transformers having a cut off frequency of no less than 100 kiloHertz (100 kHz); no less than 500 kHz; or no less than 1 megaHertz (1 MHz); and one or more processors and storage locations configured to transform an incoming parallel data stream into serial data stream. In some embodiments, the NIC can communicate using a second signal format where the signals transmitted to and from the NIC operate at a minimum frequency of at least 1 MHz; at least 5 MHz; or at least 10 MHz.

Figure 2:
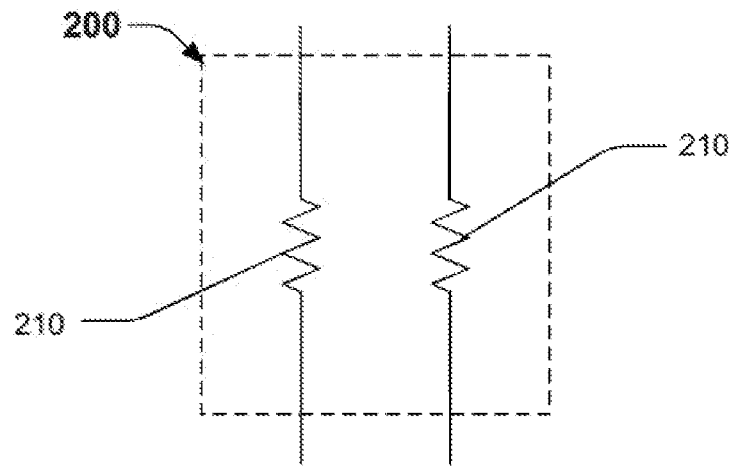
FIG. 2 is a schematic diagram depicting an illustrative first isolator, according to one or more embodiments described.

FIG. 2 is a schematic diagram depicting an illustrative first isolator 200, according to one or more embodiments. The first isolator 200 can be disposed between the modular interface 110 and the first I/O device 130. The first isolator 200 can include one or more systems or devices adapted to pass one or more signals using a first signal format while impeding the passage of one or more signals using a second signal format. In some embodiments, the first isolator 200 can also suppress, mitigate, or even prevent the reflection of signals using a second signal format from the first I/O device. In some embodiments, the first isolator 200 can include a circuit incorporating a resistance 210. The resistance 210 can be disposed on each of the two conductors 150, 160 coupling the modular interface 110 to the first I/O device.

The resistance 210 can include any system, device, or combination of systems and devices suitable for providing a predetermined resistance to electrical flow along the common conductors 150, 160 linking the modular interface 110 with the first I/O device 130. The resistance can be about 500 ohms or greater, about 1,000 ohms or greater; about 2,000 ohms or greater; or about 5,000 ohms or greater. Where a telephonic signal compliant with the first signal format (i.e., a relatively high power signal operating at less than 100 kHz) is applied to the common conductors 150, 160 in the modular interface 110, the resistances 210 will permit the passage of the relatively high power telephonic signal. Conversely, when a network signal compliant with the second signal format (i.e. a relatively low power signal operating at greater than 1 MHz) is applied to the common conductors 150, 160, the resistances 210 will attenuate the passage of the relatively low power network signal to the first I/O device 130. In addition, the resistances 210 can also act to suppress the reflection of at least a portion of the relatively high frequency second signal format signal from the first I/O device 130, reducing the tendency for detrimental signal interference due to the reflection along the common conductors 150, 160 at the second I/O device 140.

Figure 3:
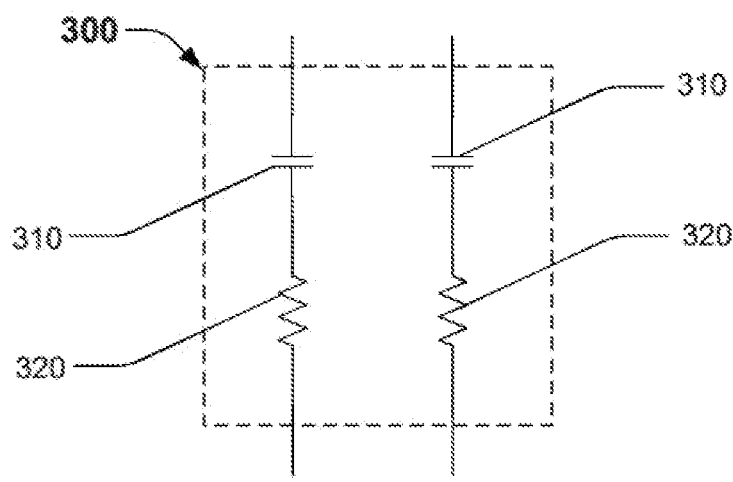
FIG. 3 is a schematic diagram depicting an illustrative second isolator, according to one or more embodiments described.

FIG. 3 is a schematic diagram depicting an illustrative second isolator 300, according to one or more embodiments. The second isolator 300 can be disposed between the modular interface 110 and the second I/O device 140. The second isolator 300 can include one or more systems or devices adapted to pass one or more signals using the second signal format while impeding the passage of one or more signals using the first signal format. In some embodiments, the second isolator 300 can include a first order, high pass, filter including at least one capacitor 310 and at least one resistor 320 (an "RC filter"). In at least some embodiments, the RC filter can be disposed on each of the two conductors 150, 160 coupling the modular interface 110 to the second I/O device.

The capacitance of the capacitor 310 in the second isolator 300 can be about 1,000 picoFarads (pF) or greater; about 2,000 pF or greater; or about 3,800 pF or greater. The resistance of the resistor 320 in the second isolator 300 can be about 100 ohms or less; about 50 ohms or less; or about 5 ohms or less.

Since the first I/O device 130 and the second I/O device 140 share common conductors 150, 160, the capacitor 310 and resistor 320 disposed in the second isolator 300 may be exposed to testing or certification procedures related to the first I/O device 130 using voltages or other conditions not ordinarily encountered by the second I/O device 140. For example during testing of a telephonic modem as the first I/O device 130, AC or DC test voltages of up to 3,000 V (3 kV) may be applied across the common conductors 150, 160. During such testing the capacitor 310 will present a high impedance to the test voltage, therefore the minimum voltage rating of the capacitor 310 can be about 1,000 V (1 kV) or greater; about 2 kV or greater; about 3 kV or greater, or about 5 kV or greater.

Where a network signal compliant with the second signal format (i.e., a relatively low power signal operating at greater than 1 MHz) is applied across the common conductors 150, 160, the second isolator 300 will permit the passage of the relatively high frequency network signal to the second I/O device 140. Conversely, when a telephonic signal compliant with the first signal format (i.e. a relatively high power signal operating at less than 100 kHz) is applied across the common conductors 150, 160, the capacitance 310 present within the second isolator 300 will provide a significant impedance (on the order of several thousand ohms) to the transmission of a first signal format signal, thereby minimizing the transmission of the first signal format signal to the second I/O device 140.

Figure 4:
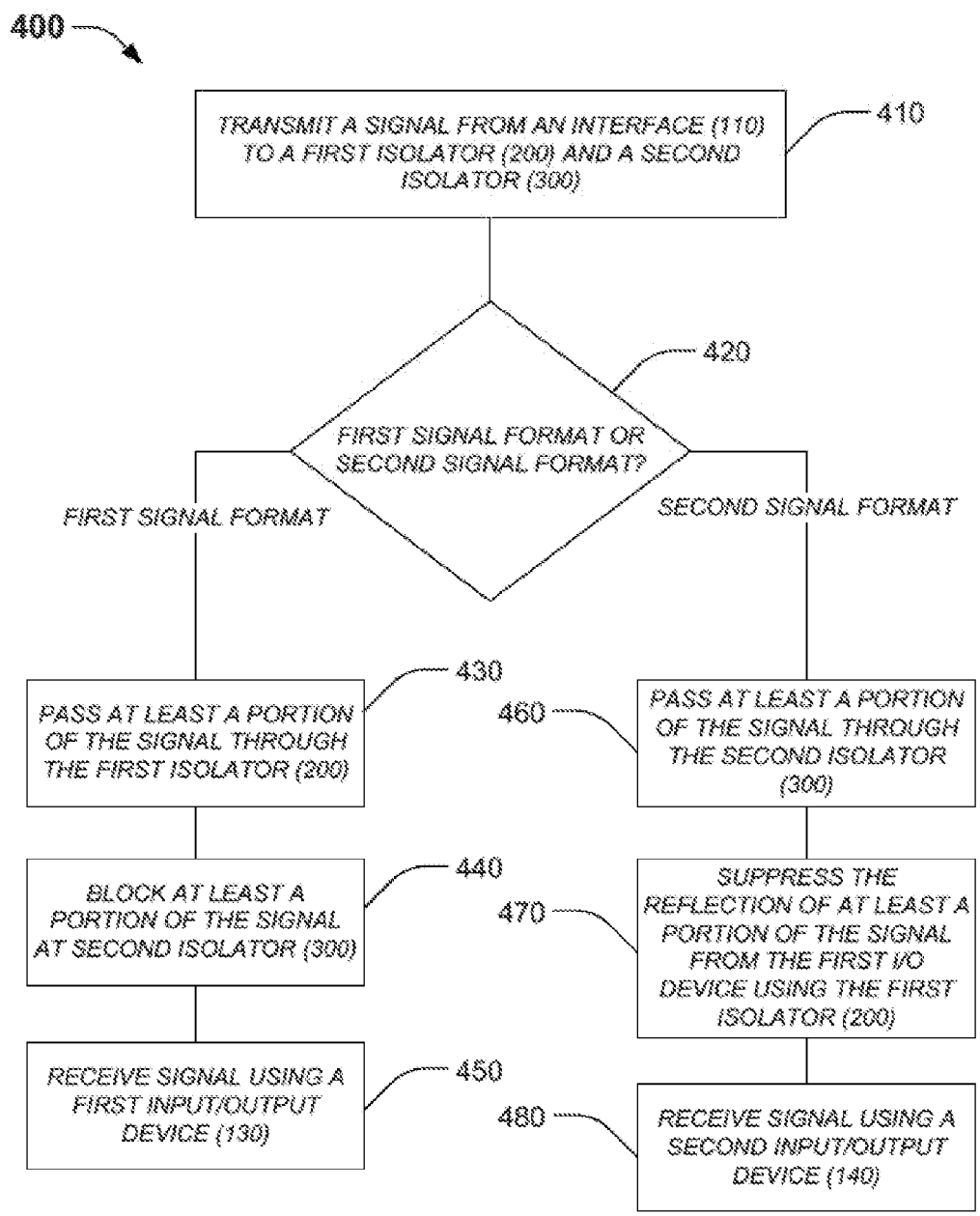
FIG. 4 is a flow diagram depicting an illustrative interface method, according to one or more embodiments described.

FIG. 4 is a flow diagram depicting an illustrative interface method 400, according to one or more embodiments described. The method 400 can include transmitting a signal from a modular interface 110 to a first isolator 200 and a second isolator 300 at 410. Dependent upon whether the signal at the modular interface is presented in the first signal format or the second signal format, the method proceeds appropriately at 420.

If a relatively high power signal operating at a frequency of less than 100 kHz (i.e. a signal using the first signal format) is provided at the modular interface 110, at least a portion of the signal can be passed through the first isolator 200 at 430. Additionally, at least a portion of the signal can be blocked by the second isolator 300 at 440. All or a portion of the signal passed by the first isolator 200 can be received using the first I/O device 130 at 450.

On the other hand, a relatively low power signal operating at a frequency of greater than 10 MHz (i.e. a signal using the second signal format) is provided at the modular interface 110, at least a portion of the signal can be passed through the second isolator 300 at 460. Additionally, the reflection of at least a portion of the signal from the first I/O device 130 can be suppressed using the first isolator 200 at 470. All or a portion of the signal passed by the second isolator 300 can be received using the second I/O device 140 at 480.

Figure 5:
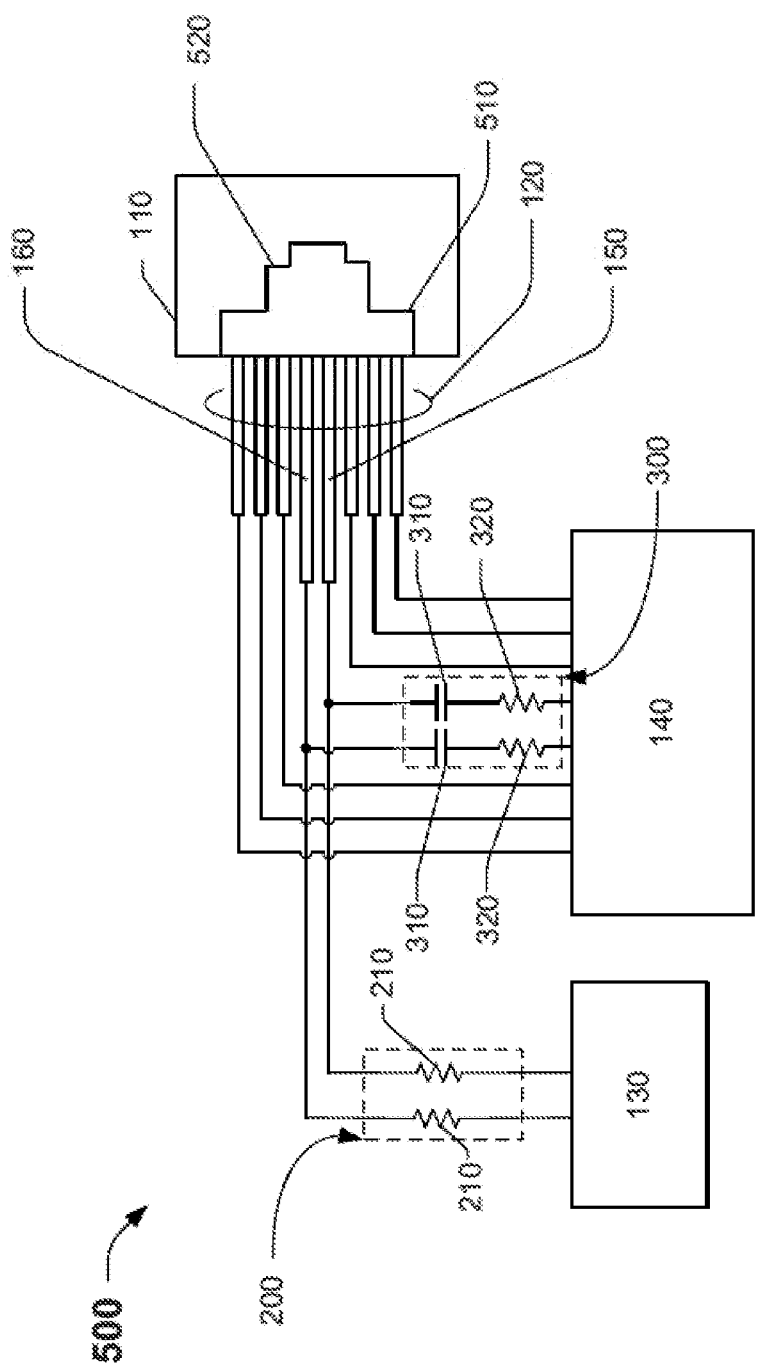
FIG. 5 is a schematic diagram depicting another illustrative interface system, according to one or more embodiments described.

FIG. 5 is a schematic diagram depicting another illustrative interface system 500, according to one or more embodiments. The system 500 can include a modular interface 110 configured to accept the insertion of both an RJ-45 network connector 510 and an RJ-11 telephonic connector 520. The RJ-11 connector can include up to four conductors, while the RJ-45 connector can include up to eight conductors. The RJ-11 and RJ-45 connectors can share the common conductors 150, 160 when attached to the modular interface 110.

A first signal format compliant signal can be communicated via an RJ-11 connector attached or otherwise coupled to the modular interface 110. The first signal format can include a relatively high power telephonic signal operating at a signal frequency of 60 kHz or less. A second signal format compliant signal can be communicated via an RJ-45 connector attached or otherwise coupled to the modular interface 110. The second signal format can include a relatively low power network signal operating at a frequency of 10 MHz or greater.

The first isolator 200 can include resistances 210. The resistance of the resistances 210 within the first isolator 200 can be about 500 ohms. The second isolator 300 can include a first order, high-pass, RC filter having capacitances 310 and resistances 320. The capacitance of the capacitances 310 within the second isolator 300 can be about 3,800 picoFarads (pF). The resistance of the resistances 320 within the second isolator 300 can be about 5 ohms.

When a first signal format signal is provided to the modular interface 110, the signal can pass through the first isolator 200, where the resistances 210 can provide little attenuation or degradation of signal strength. Consequently, the first signal format signal can be received by the first I/O device 130. The first format signal will be unable to pass through the second isolator 300 however, as the capacitances 310 will present a relatively large impedance to a signal operating at less than 60 kHz. Consequently, a first signal format signal will not be received at the second I/O device 140. The second isolator's 300 ability to block at least a portion of the first signal format signal from reaching the second I/O device 140 can protect the components disposed within device from the relatively high power first signal format signal.

When a second signal format signal is provided to the modular interface 110, the signal will pass through the second isolator 300, where the capacitances 310 and the resistances 320 provide a minimal impedance to a signal operating at a minimum frequency of 10 MHz. Consequently, the second signal format signal can be received at the second I/O device 140. The second signal format signal can also pass through the first isolator 200, however the relatively high resistances 210 within the first isolator 200 will attenuate the relatively low power signal. Since the second signal format signal operates at a frequency in excess of 10 MHz, reflection of some or all of the signal from the first I/O device 130 can occur. However, any portion of the second signal format signal reflected from the first I/O device 130 can be further attenuated by the first isolator 200, thus the first isolator 200 can assist in suppressing the reflection of the second signal format signal from the first I/O device 130 to the second I/O device 140. If such reflection were not suppressed, detrimental signal interface at the second I/O device 140 may occur.

What is claimed is:

1. An interface system, comprising:
    a first isolator and a second isolator coupled to a modular interface, said interface comprising a plurality of conductors;
    the first isolator coupled to a first signal format compliant first input/output (I/O) device;
    the second isolator coupled to a second signal format compliant second I/O device;
    the first isolator to pass a first signal format compliant signal and to suppress a reflection of at least a portion of a second signal format compliant signal from the first I/O device; and
    the second isolator to at least partially block a first signal format compliant signal and to pass a second signal format compliant signal to the second I/O device, wherein the second isolator comprises a first order, high-pass, RC filter having a minimum capacitance of 1,000 pico-Farads (pF) and further wherein the capacitance is rated for a minimum voltage of 3,000 Volts (3 kV).

2. The system of claim 1, wherein the first signal format comprises a signal operating at a frequency of less than 100 Kilohertz (KHz).

3. The system of claim 1, wherein the second signal format comprises a signal operating at a frequency of at least 10 Megahertz (MHz).

4. The system of claim 1, wherein the first isolator comprises a resistance.

5. The system of claim 1, wherein the modular interface comprises a Registered Jack 45 (RJ-45) modular jack.

6. The system of claim 1,
    wherein the first I/O device comprises a telecommunications interface; and
    wherein the second I/O device comprises a network interface card (NIC).

7. The system of claim 1, wherein the modular interface comprises an interface permitting the detachable attachment of a plurality of modular connectors, the modular connectors selected from the group consisting of: a Registered Jack 11 (RJ-11) connector, and a Registered Jack 45 (RJ-45) connector.

8. An interface method, comprising:
    transmitting a signal from a modular interface to a first isolator coupled to a first signal format compliant first input/output (I/O) device and to a second isolator coupled to a second signal format compliant second I/O device, wherein the first isolator comprises a resistance, and the second isolator comprises a first order, high-pass, RC filter having a minimum capacitance of 1,000 pico-Farads (pF), the capacitance being rated for a minimum voltage of 3,000 Volts (3 kV);
    passing at least a portion of a first signal format compliant signal through the first isolator to the first I/O device and suppressing at least a portion of a reflection of a second signal format compliant signal from the first I/O device; and
    passing at least a portion of the second signal format compliant signal through the second isolator to the second I/O device and blocking at least a portion of the first signal format compliant signal from the second I/O device.

9. The method of claim 8, wherein the modular interface comprises an interface permitting the detachable attachment of a plurality of modular connectors, the modular connectors selected from the group consisting of: a Registered Jack 11 (RJ-11) connector, and a Registered Jack 45 (RJ-45) connector.

10. The method of claim 8,
    wherein the first signal format comprises a signal operating at a frequency of less than 100 Kilohertz (KHz); and wherein the second signal format comprises a signal operating at a frequency of 10 Megahertz (MHz) or greater.

11. The method of claim 8,
wherein the first I/O device comprises a telecommunications interface; and
wherein the second I/O device comprises a network interface card (NIC).

12. An interface system, comprising:
a modular interface to accommodate a plurality of connectors, each of the plurality of connectors being selected a the group of connectors consisting of: a Registered Jack 11 (RJ-11) connector, and a Registered Jack 45 (RJ-45) connector;
a first signal format compliant first input/output (I/O) device coupled to the modular interface,
  wherein the first I/O device comprises a telecommunications interface, and
  wherein the first signal format comprises a signal operating at a frequency of less than 100 Kilohertz (KHz);
a second signal format compliant second I/O device coupled to the modular interface;
  wherein the second I/O device comprises a network interface card, and
  wherein the second signal format comprises a signal operating at a frequency of greater than 10 Megahertz (MHz);
a first isolator disposed between the modular interface and the first I/O device, the first isolator comprising a minimum resistance of 100 ohms;
  wherein the first isolator passes a first signal format compliant signal to the first I/O device and suppresses a reflection from the first I/O device at least a portion of a second signal format compliant signal; and
a second isolator disposed between the modular interface and the second I/O device, the second isolator comprising a first order, high-pass, RC filter;
  wherein the RC filter comprises a minimum capacitance of 1,000 pico-Farads (pF) and a maximum resistance of 1,000 ohms;
  wherein the capacitance is rated for a maximum voltage of 5,000 Volts (5 kV); and
  wherein the second isolator at least partially blocks the first signal format compliant signal from, and passes the second signal format compliant signal to, the second I/O device.

* * * * *

UNITED STATES PATENT AND TRADEMARK OFFICE
CERTIFICATE OF CORRECTION

| | | |
|---|---|---|
| PATENT NO. | : 9,219,462 B2 | Page 1 of 1 |
| APPLICATION NO. | : 13/825638 | |
| DATED | : December 22, 2015 | |
| INVENTOR(S) | : Adnan A. Siddiquie et al. | |

It is certified that error appears in the above-identified patent and that said Letters Patent is hereby corrected as shown below:

In the Claims

In column 9, lines 10-11, in Claim 12, delete "a the" and insert -- a --, therefor.

Signed and Sealed this
Seventh Day of June, 2016

Michelle K. Lee
*Director of the United States Patent and Trademark Office*